(12) United States Patent
Fink

(10) Patent No.: US 9,478,996 B2
(45) Date of Patent: Oct. 25, 2016

(54) BATTERY CELL UNIT COMPRISING A BATTERY CELL AND A MONITORING AND ACTUATION UNIT FOR MONITORING THE BATTERY CELL AND METHOD FOR MONITORING A BATTERY CELL

(71) Applicants: Robert Bosch GmbH, Stuttgart (DE);
Samsung SDI Co., Ltd., Yongin-si, Gyeonggi-do (KR)

(72) Inventor: Holger Fink, Stuttgart (DE)

(73) Assignees: Robert Bosch GmbH, Stuttgart (DE);
Samsung SDI Co., Ltd., Yongin-si, Gyeonggi-do (KR)

( * ) Notice: Subject to any disclaimer, the term of this patent is extended or adjusted under 35 U.S.C. 154(b) by 189 days.

(21) Appl. No.: 14/212,973

(22) Filed: Mar. 14, 2014

(65) Prior Publication Data

US 2014/0266064 A1 Sep. 18, 2014

(30) Foreign Application Priority Data

Mar. 15, 2013 (DE) .......................... 10 2013 204 526

(51) Int. Cl.
*H02J 7/00* (2006.01)
*G01R 31/36* (2006.01)
*G01R 31/42* (2006.01)

(52) U.S. Cl.
CPC ............ *H02J 7/0029* (2013.01); *H02J 7/0026* (2013.01); *H02J 7/0031* (2013.01); *G01R 31/3606* (2013.01); *G01R 31/42* (2013.01); *H02J 2007/0037* (2013.01); *Y02T 10/7055* (2013.01)

(58) Field of Classification Search
CPC . G01R 31/3606; G01R 31/42; H02J 7/0037; H02J 7/0026; H02J 7/0029; H02J 7/0031; Y02T 10/7055

See application file for complete search history.

(56) References Cited

U.S. PATENT DOCUMENTS

| 2012/0217797 | A1* | 8/2012 | Butzmann | ........... H01M 10/441 307/9.1 |
| 2013/0128635 | A1* | 5/2013 | Korn | ........................ H02H 7/10 363/50 |
| 2014/0093751 | A1* | 4/2014 | Schaefer | ............. H01M 2/1072 429/7 |

FOREIGN PATENT DOCUMENTS

| DE | 10 2011 113 798 A1 | 5/2012 |
| DE | 10 2010 064 325 A1 | 7/2012 |
| DE | 10 2011 003 810 A1 | 8/2012 |

* cited by examiner

*Primary Examiner* — Vuthe Siek
(74) *Attorney, Agent, or Firm* — Maginot, Moore & Beck LLP

(57) ABSTRACT

A battery cell unit includes a battery cell and a monitoring and actuation unit for monitoring the function state of the battery cell. A coupling unit is provided in the battery cell unit, in which coupling unit two half-bridges forming a full-bridge are arranged, which half-bridges each comprise a first power semiconductor coupled to a positive pole of the battery cell, a second power semiconductor coupled to a negative pole of the battery cell and a central connection and are connected to a respective other output terminal of the battery cell unit via the respective central connection. The battery cell is configured to operate, in the normal operating mode, the power semiconductors of the half-bridges in such a way that a battery cell voltage of the battery cell is present at the output terminals of the battery cell unit optionally with a positive or negative orientation.

5 Claims, 6 Drawing Sheets

BATTERY CELL UNIT COMPRISING A BATTERY CELL AND A MONITORING AND ACTUATION UNIT FOR MONITORING THE BATTERY CELL AND METHOD FOR MONITORING A BATTERY CELL

This application claims priority under 35 U.S.C. §119 to patent application no. DE 10 2013 204 526.3, filed on Mar. 15, 2013 in Germany, the disclosure of which is incorporated herein by reference in its entirety.

The present disclosure relates to a battery cell unit comprising a battery cell and a monitoring and actuation unit for monitoring the function state of the battery cell. The disclosure also relates to a method for monitoring the function state of a battery cell arranged in a battery cell unit by means of a monitoring and actuation unit provided in the battery cell unit. In addition, the disclosure relates to a battery system which comprises a battery comprising at least one battery string in which a plurality of battery cell units according to the disclosure are arranged and a battery management system.

BACKGROUND

It is conventional to refer to batteries for use in hybrid and electric vehicles as traction batteries since these batteries are used for feeding electric drives. FIG. 1 illustrates the basic circuit diagram of a battery system 10 comprising such a traction battery 20. The battery 20 comprises a plurality of battery cells 21. For the purpose of simplifying the illustration in FIG. 1, only two battery cells have been provided with the reference symbol 21.

The battery 20 is formed from two battery cell series circuits 22, 23, which each comprise a plurality of battery cells 21 connected in series. These battery cell series circuits 22, 23 are each connected to a battery terminal 24, 25 and to a connection of a service plug 30.

The positive battery terminal 24 is connectable to the battery 20 via a disconnecting and charging device 40, which comprises a switch disconnector 41 which is connected in parallel with a series circuit comprising a charging switch 42 and a charging resistor 43. The negative battery terminal 25 is connectable to the battery 20 via a disconnecting device 50, which comprises a further switch disconnector 51.

In addition, FIG. 2 shows a diagram 60 which illustrates, in very schematized form, the various fault mechanisms 61 of lithium-ion batteries and the consequences 62 thereof. These illustrated fault mechanisms 61 can result in thermal runaway 64 of the battery cells caused by an impermissible increase in temperature 63. In the event of the occurrence of a thermal runaway 64, as a result of an emission of gas 65 which can occur, for example, on opening of a rupture valve as a consequence of increased battery cell internal pressure, a fire in the battery cells 66 or, in an extreme case, even rupture of the battery cells 67 can occur. Therefore, the occurrence of thermal runaway 64 when using the battery cells in traction batteries needs to be ruled out with the greatest possible probability close to 1.

Thermal runaway 64 can occur in the case of overcharging of a battery cell 70, as a consequence of deep discharge of a battery cell 80 during the subsequent charging operation or in the event of the presence of impermissibly high charging and discharge currents of the battery cell which can result from an external short circuit 90, for example. In addition, thermal runaway 64 can also occur in the event of the presence of a battery cell-internal short circuit 100, which can arise, for example, as a consequence of a severe mechanical force effect during an accident 101 or as a consequence of the formation of battery cell-internal dendrites 102, which can arise, for example, in the event of the presence of excessively high charging currents at low temperatures. Furthermore, thermal runaway 64 can also occur as a result of battery cell-internal short circuits which can be caused by impurities in the battery cells resulting during manufacture, in particular by metallic foreign particles 103 present in the battery cells. Thermal runaway 64 can also occur in the event of the presence of impermissible heating of the battery cells 110 which can arise, for example, as a consequence of a vehicle fire or in the event of the presence of an overload of the battery cells 120.

FIG. 3 illustrates the basic circuit diagram of a battery system 10 known from the prior art which comprises a traction battery 20 comprising a plurality of battery cells 21 and a battery management system (BMS) 11. The electronics of the battery management system 11 have a decentralized architecture, in which the monitoring and actuation units 130 formed from the monitoring electronics (CSC electronics) of the battery cells 21 are in the form of satellites, which are each provided for monitoring the function state of one or more battery cells 21 and communicate with a central battery control device (BCU) 140 via an internal bus system 141.

The electronics of the battery management system 11, in particular the monitoring electronics of the battery cells 21, are necessary in order to protect the battery cells 21 from the critical states illustrated in FIG. 2, which can result in thermal runaway. A high degree of complexity is involved in the electronics of the battery management system 11 in order firstly to protect the battery cells 21 from overload due to external causes such as, for example, due to a short circuit in the inverter of an electric drive, and secondly to avoid a situation whereby the battery cells are endangered by malfunction of the electronics of the battery management system 11, such as, for example, by faulty detection of the battery cell voltages by the monitoring and actuation units 130.

As is the case for the battery system 10 illustrated in FIG. 1, in the battery system 10 illustrated in FIG. 3 the traction battery is connectable to a positive battery terminal 24 via a disconnecting and charging device 40 20 and is connectable to a negative battery terminal 25 via a disconnecting device 50. In this case, in each case the same reference symbols have been used for denoting identical or similar components for the battery systems illustrated in FIGS. 1 and 3.

In addition, the central battery control device 140 is designed to actuate the switch disconnector (relay) 41 and the charging switch (relay) 42 of the disconnecting and charging device 40. The actuation of the switch disconnector 41 and the charging switch 42 by means of the battery control device 140 is symbolized by the arrow 142 in the drawing. The central battery control device 140 is also designed to actuate the further switch disconnector (relay) 51 of the disconnecting device 50. The actuation of the switch disconnector 51 by means of the battery control device 140 is symbolized by the arrow 143.

The central battery control device 140 is connected to a respective other battery terminal 24, 25 in each case via a high-voltage line 144, 145. In addition, the central battery control device 140 comprises current sensors 150, 160, which are provided for measuring a current flowing through the traction battery 20. The battery control device 140 also communicates with a vehicle interface via a CAN bus 146.

Information relating to the function state of the vehicle can be provided to the battery control device 140 via the CAN bus.

When using a battery management system 11 of a battery system known from the prior art, it is therefore desired to increase the safety of the battery system 10 such that no unreasonable risk occurs. In doing so, pursuant to ISO 26262, stringent requirements are placed on the functional safety of the battery management system 10 since a malfunction of the electronics, as explained already above, can result in a risk. In addition, safety tests are stipulated for lithium-ion battery cells. In order to be able to transport the battery cells, for example, UN transport tests need to be performed. The test results need to be evaluated in accordance with the EUCAR hazard levels. The battery cells in the process need to adhere to prescribed minimum safety levels. In order to achieve this, extensive additional measures are taken in the battery cells which are intended for use in traction batteries.

For battery management systems 11 for battery systems 11 comprising traction batteries 20 for electric vehicles and plug-in hybrids, presumably grading in accordance with the hazard level ASIL C will be established if the safety of the battery cells 21 cannot be significantly increased. Such additional measures will be taken by virtue of the fact that so-called safety devices are integrated in the battery cells. Typically, the safety devices specified below are thus integrated in the battery cells.

An overcharge safety device (OSD) is integrated in a battery cell. Such an overcharge safety device has the effect that the battery cell does not exceed an EUCAR hazard level 4 during an overcharging operation. The permissible range for the battery cell voltage ends at 4.2 V. In the case of an overcharging operation, above a battery cell voltage of approximately 5 V, such a high internal pressure builds up in the battery cell that a membrane of the overcharge safety device curves outwards and the battery cell is electrically short-circuited. As a result of this, the battery cell is discharged until a battery cell-internal fuse is activated. The short circuit in the battery cell between the two poles of the battery cell is maintained via the overcharge safety device.

In addition, a battery cell fuse is integrated in the battery cell. This fuse integrated in the battery cell is a very effective protective instrument on a battery cell level, but causes considerable problems when using the battery cells to construct a series circuit in a battery module or in a battery system. In these cases these measures are rather counterproductive.

A nail penetration safety device (NDS) is also integrated in a battery cell. A nail penetration safety device protects the battery cell by virtue of such a defined short-circuit path which does not result in such severe local heating of the battery cell in the region of the nail penetration that local melting of the separator provided could result being constructed when a nail or a pointed object penetrates into the battery cell.

A safety function layer (SFL) is also integrated in a battery cell. The safety function layer is realized by the ceramic coating of one of the two electrodes of the battery cell, preferably by the ceramic coating of the anode. In the event of melting of the separator, an areal short circuit of the battery cell and therefore extremely rapid conversion of the electrical energy from the battery cell into lost heat can be prevented by means of the safety function layer.

A crush safety device is in addition also integrated in a battery cell. The crush safety device has a similar mode of operation to the nail penetration safety device. In the event of a severe mechanical deformation of the battery cell housing, a defined short-circuit path is provided in the battery cell which prevents severe local heating of the battery cell and thus increases the safety of the battery cell.

In the battery cells under development at present, in particular the measures for the electrical safety which protect against overcharging, for example, or ensure overcurrent protection are associated with considerable complexity. In addition, these measures tend to be even rather counterproductive instead of expedient once a battery cell is used in a battery module or in a battery system. For example, on activation of the fuse of a battery cell, the situation may arise whereby the electronics of the existing battery management system (BMS) are subject to very high negative voltages. This results in additional complexity on the battery system level since the transport regulations at the battery cell level need to be adhered to without another benefit being associated with this.

SUMMARY

The disclosure provides a battery cell unit comprising a battery cell and a monitoring and actuation unit for monitoring the function state of the battery cell. In this case, a coupling unit comprising two half-bridges is arranged in the battery cell unit, each of which half-bridges comprises a first power semiconductor coupled to a positive pole of the battery cell, a second power semiconductor coupled to a negative pole of the battery cell and a central connection. The half-bridges are connected to a respective other output terminal of the battery cell unit via the respective central connection. In addition, the battery cell unit is designed to operate, in a normal operating mode, the coupling unit by means of actuation by the monitoring and actuation unit in such a way that the first power semiconductor in a half-bridge and the second power semiconductor in the other half-bridge are switched on and the respective other power semiconductors in the half-bridges are switched off, with the result that a battery cell voltage of the battery cell is present at the output terminals of the battery cell unit optionally with a positive or negative orientation.

The disclosure also provides a method for monitoring a battery cell arranged in a battery cell device by means of a monitoring and actuation unit provided in the battery cell device. In this case, the battery cell is operated by means of a coupling unit which is arranged in the battery cell unit and which comprises half-bridges comprising power semiconductors which form a full bridge. If a fault situation or hazard situation of the battery cell which deviates from a normal operating mode of the battery cell is established by the monitoring and actuation unit, the battery cell is set to a safe state by means of actuation of the coupling unit and/or of a discharge circuit coupled to the poles of the battery cell for rapid discharge of the battery cell.

The disclosure further provides a battery system which comprises a battery comprising at least one battery string, in which a plurality of the battery cell units according to the disclosure are arranged. In addition, the battery system comprises a battery management system, wherein the battery management system is designed to communicate with the monitoring and actuation units of the battery cell units.

Worded illustratively according to the disclosure is a battery cell unit which comprises an integrated monitoring and actuation function and a battery cell with an output voltage with reversible polarity. In particular owing to the coupling unit arranged in the battery cell unit and comprising four power semiconductors, it is possible, by targeted actuation of the power semiconductors, to provide a series of adjustable safety functions for safeguarding the battery cell. The safety functions can be used in a targeted manner owing to the monitoring of the battery cell by the monitoring and actuation unit. In the normal operating mode, the polarity of the battery cell in respect of an output voltage provided at the output terminals of the battery cell unit can be reversed, with the result that the battery cell arranged in the battery cell unit according to the disclosure can output the battery cell voltage with a positive or negative orientation.

Owing to the functionality of the battery cell unit according to the disclosure of reversing the polarity of the battery cell voltage, the battery cell unit according to the disclosure is suitable in particular for use in three-phase battery systems with output voltages which are adjustable in stages, which battery systems are referred to as battery direct inverters, or generally in polyphase battery systems with output voltages which are adjustable in stages.

It is preferable for the monitoring and actuation unit according to the disclosure to also be provided for actuating the power semiconductors of the coupling unit, in order to adjust a normal operating mode of the battery cell in which there is no voltage applied to the output terminal of the battery cell unit, in such a way that the first or second power semiconductors in the half-bridges are switched on. In other words, the battery cell arranged in the battery cell unit according to the disclosure can optionally also output a voltage of 0 V at the output terminals of the battery cell unit. Preferably, in this case the other two power semiconductors, i.e., for example, when the first power semiconductors are switched on both second power semiconductors, are switched off, and vice versa.

In a preferred embodiment of the disclosure, the monitoring and actuation unit according to the disclosure is designed to actuate, in the event of the presence of a battery cell voltage with a magnitude which exceeds an upper voltage limit value and/or in the event of the presence of a battery cell voltage with a magnitude which falls below a lower voltage limit value, the power semiconductors of the coupling unit in order to adjust a function state of the battery cell in which no current can flow through the battery cell in such a way that the first power semiconductors or the second power semiconductors in the half-bridges are switched on and the second or the first power semiconductors in the half-bridges are switched off.

This has the advantage that the monitoring and actuation unit identifies a threat of overcharging of the battery cell operating in the normal operating mode on the basis of an upper limit value for the battery cell voltage being exceeded, and the battery cell can then favorably not be charged any further and can thus be protected safely from overcharging, for example in the event of a malfunction of a battery charger.

In addition, the monitoring and actuation unit identifies a threat of deep discharge from the battery cell operating in the normal operating mode on the basis of a lower limit value for the battery cell voltage being undershot, wherein the battery cell is transferred to a safe state in which there is no longer any current flowing through the actual battery cell. A current which can possibly be output to the outside via an entire battery system including the battery cell unit according to the disclosure only flows in the battery cell unit according to the disclosure via the power semiconductors present in the battery cell unit, i.e. the power semiconductors or semiconductor switches.

In a further preferred embodiment of the disclosure, the monitoring and actuation unit according to the disclosure is provided for actuating, in the event of the presence of a charging current with a magnitude which exceeds a predetermined or suitably selected charging current limit value and/or in the presence of a discharge current with a magnitude which exceeds a predetermined or suitably selected charging current limit value, the power semiconductors of the coupling unit so as to set a function state of the battery cell in which no more current can flow through the battery cell in such a way that the first or second power semiconductors in the half-bridges are switched on and the second or first power semiconductors in the half-bridges are switched off.

Thus, the monitoring and actuation unit identifies, starting from the battery cell operating in the normal operating mode, a threat of overload as a result of excessively high discharge currents which can occur, for example, as a consequence of an external short circuit of the battery as a result of a fault in the inverter. In this case, the battery cell is transferred to a safe state in which there is no current flowing through the battery cell. The battery cell is thus protected from loading with impermissibly high discharge currents.

In addition, the monitoring and actuation unit, starting from the battery cell operating in the normal operating mode, identifies a threat of overload of the battery cell from excessively high charging currents, wherein the battery cell then transfers to the safe state in which there is no longer any current flowing through the battery cell. The battery cell is thus protected from loading with impermissibly high charging currents. This is particularly advantageous, for example, in the event of the presence of very low temperatures at which the battery cell is particularly sensitive in respect of a lithium plating which can be formed on the anode.

In a particularly advantageous embodiment of the disclosure, the monitoring and actuation unit according to the disclosure is designed to identify the presence of a hazard situation in which the battery cell can be damaged on the basis of an evaluation of information communicated in particular by a battery management system. In addition, the monitoring and actuation unit according to the disclosure can in this case be provided to actuate, in the event of the presence of the hazard situation, the power semiconductors of the coupling unit so as to discharge the battery cell by means of at least one of the two half-bridges in such a way that the first or second power semiconductor in a half-bridge is switched on and the second or first power semiconductor in the same half-bridge operates in the so-called active operating mode as controllable resistance and preferably the first and second power semiconductors of the other half-bridge are switched off or the first or second power semiconductors in the two half-bridges are switched on and the second or first power semiconductors in the two half-bridges operate in the active operating mode.

In other words, in a case in which the electronics of the monitoring and actuation unit of the battery cell unit which has intrinsic safety in accordance with the disclosure are communicated a corresponding information item by a battery management system, for example, in respect of the fact that the vehicle in which the battery system according to the disclosure is installed has had an accident, the battery cell can be discharged via one of the two half-bridges or else in parallel via both half-bridges. During the discharge of the battery cell via one of the two half-bridges, the battery cell does not output a voltage to the output terminals of the battery cell unit and is favorably nevertheless slowly discharged. A power semiconductor operated in particular as controllable resistance is in this case designed corresponding to the requirements, including in terms of its thermal connection and cooling.

The battery cell arranged in the battery cell unit with intrinsic electrical safety in accordance with the disclosure, in conjunction with the coupling unit and monitoring and actuation unit associated with this battery cell and provided in the battery cell unit, is designed to be so safe that, in comparison with a battery management system for a battery system known from the current prior art, in the battery system according to the disclosure now substantially less stringent requirements need to be placed on the battery management system. Furthermore, numerous measures which until now have typically been carried out but without any reward, such as, for example, equipping a battery cell with an integrated overcharge safety device and/or an integrated battery cell fuse, can be dispensed with.

In another particularly advantageous embodiment of the disclosure, the monitoring and actuation unit is designed to identify, on the basis of an evaluation of a measured cell temperature of the battery cell and/or an evaluation of the battery cell voltage, the presence of a hazard situation, in particular in the case of a cell temperature which exceeds a predetermined temperature limit value and/or a voltage dip in the battery cell voltage.

In a further particularly preferred embodiment of the disclosure, the battery cell unit is additionally equipped with a discharge circuit coupled to the poles of the battery cell, in particular a discharge circuit comprising a series circuit comprising a power semiconductor and a resistor. In this case, the battery cell unit can be designed to actuate, in the event of the presence of a hazard situation, the discharge circuit in such a way that discharge of the battery cell by means of the discharge circuit, in particular discharge of the battery cell with a discharge current flowing through the discharge circuit which corresponds to a predetermined fraction of a short-circuit current of the battery cell can take place. One advantage of this consists, for example, in that the realizable discharge currents in this case in particular are not limited owing to thermal power loss which results in the case of a power semiconductor operated as controllable resistance or which can be imposed on the power semiconductors in the continuous operation mode.

Therefore, when a communication is made by a battery management system to the electronics of the monitoring and actuation unit of the battery cell unit with intrinsic safety according to the disclosure in respect of the fact that the vehicle with the battery system according to the disclosure has had an accident, the battery cell can be discharged as quickly as possible via the discharge circuit, which is also referred to below as ultrafast discharge device (UFDD).

In order to support the discharge circuit, the battery cell can at the same time also be discharged via the two half-bridges.

In accordance with one aspect, on the basis of the identification, according to the disclosure, of a hazard situation, in particular also the implementation of a test operation during which the battery cell is tested or other comparable situations for the battery cell can advantageously be identified reliably.

If the battery cell of the battery cell unit according to the disclosure is subjected to a nail penetration test or a crush test, for example as part of a UN transport test, the electronics of the monitoring and actuation unit according to the disclosure identify, by means of the evaluation of the battery cell voltage, that the battery cell is being discharged via currents, without said battery cell being operated. The identification of this operation can take place via a voltage dip in the battery cell, for example. As a result of this, discharge of the battery cell is immediately initiated via the discharge circuit according to the disclosure, and the battery cell is then substantially discharged via the discharge circuit. Optionally as already explained discharge of the battery cell can also be assisted here via the two half-bridges.

If the battery cell of the battery cell unit according to the disclosure is subjected to severe heating, this can be identified via the electronics of the monitoring and actuation unit according to the disclosure. As a consequence of this, the discharging of the battery cell is initiated immediately, for example, via the discharge circuit according to the disclosure and the battery cell is discharged via the discharge circuit in good time.

By way of summary, the battery cell which is arranged in the battery cell unit with intrinsic electrical safety according to the disclosure can, in conjunction with the coupling unit associated with this battery cell and provided in the battery cell unit, the discharge circuit (ultrafast discharge device) and monitoring and actuation unit, be configured so as to be so safe that substantially less stringent requirements can be placed on a battery management system for a battery system according to the disclosure with a plurality of such battery cell units according to the disclosure than on a battery management system for a battery system known from the current prior art. Furthermore, the measures which are carried out today without any reward, such as the provision of a battery cell with an integrated overcharge safety device and/or an integrated battery cell fuse, can be dispensed with.

The measures implemented in the battery cell for increasing safety in the event of the presence of severe mechanical force effects, such as the provision of a battery cell by the applicant with an integrated nail penetration safety device and/or with an integrated crush safety device can also be dispensed with or at least realized substantially more simply since the requirements in respect of the battery cell are less stringent in the battery cell unit according to the disclosure. It is now possible for strong mechanical force effects, such as are simulated in UN transport tests, for example, to have no hazardous effect on the battery cell. This relates in particular also to the penetration of the battery cell with pointed objects by means of a nail penetration test and/or severe deformation of the battery cell by means of crushing in respect of all three spatial axes.

The battery cell arranged in the battery cell unit according to the disclosure can protect itself from impermissible operating states by means of the electronics associated with it of the battery cell unit according to the disclosure without in the process being directed to safety functions of the electronics of a battery management system, for example.

With the battery cell units which are intrinsically electrically safe according to the disclosure, there is therefore a base module from which safe battery systems, in particular in electric and hybrid vehicles, can be built which has substantially increased safety compared to the battery systems known from the prior art.

BRIEF DESCRIPTION OF THE DRAWINGS

Exemplary embodiments of the disclosure will be described in detail below with reference to the attached drawing, in which.

DETAILED DESCRIPTION

Figure 1:
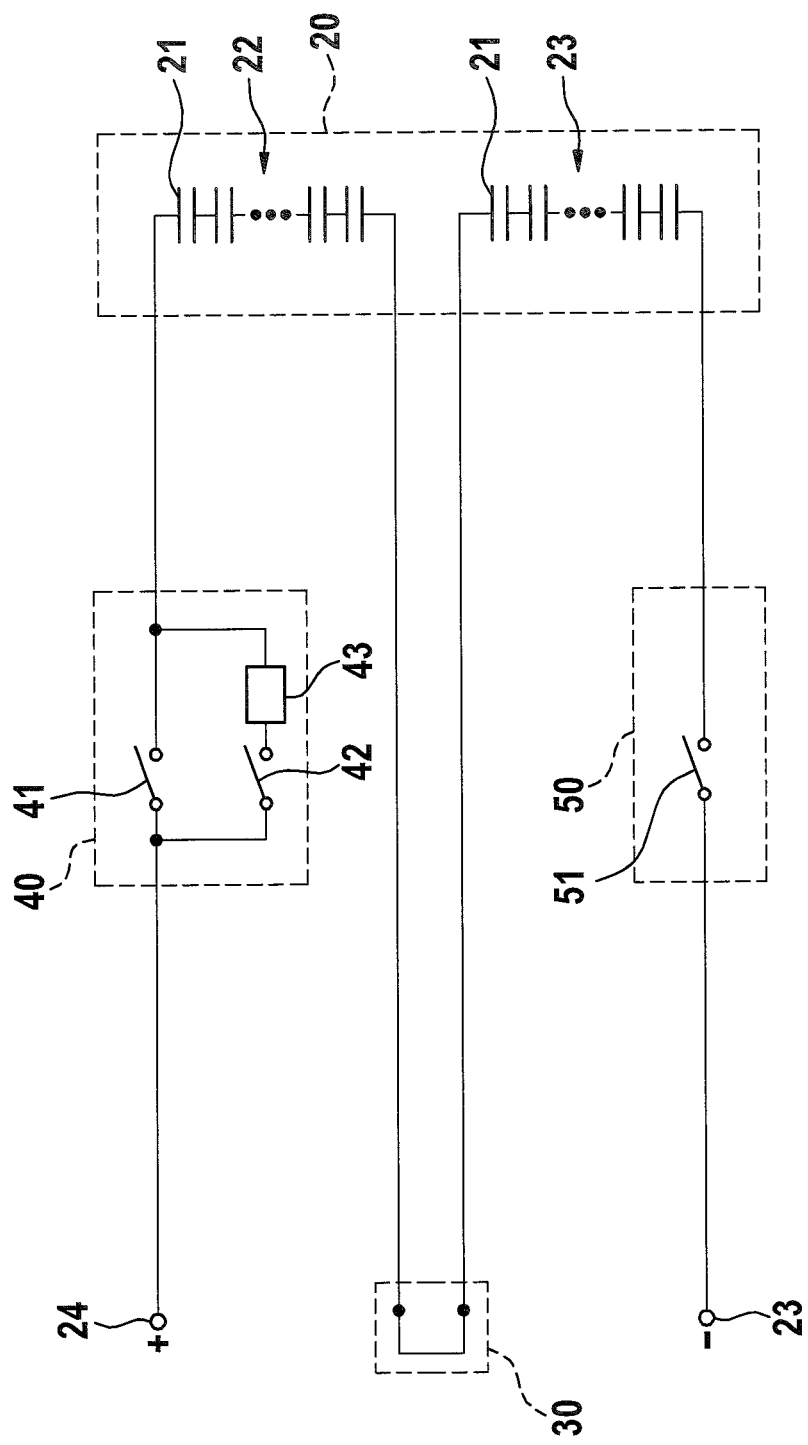
FIG. 1 shows the basic circuit diagram of a battery system known from the prior art with a traction battery.
Figure 2:
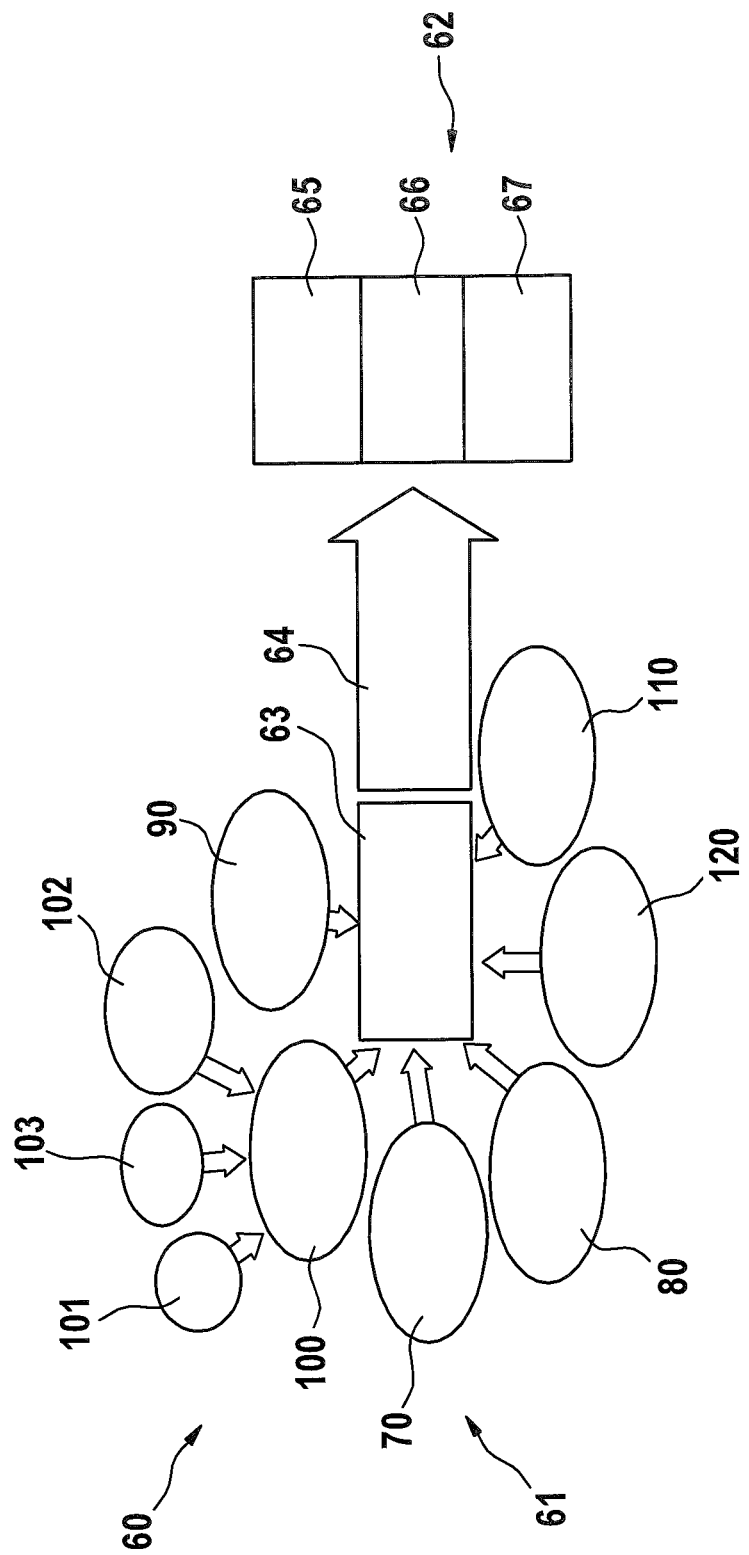
FIG. 2 shows a diagram illustrating the fault mechanisms of a lithium-ion battery known from the prior art which can lead to thermal runaway of this lithium-ion battery.
Figure 3:
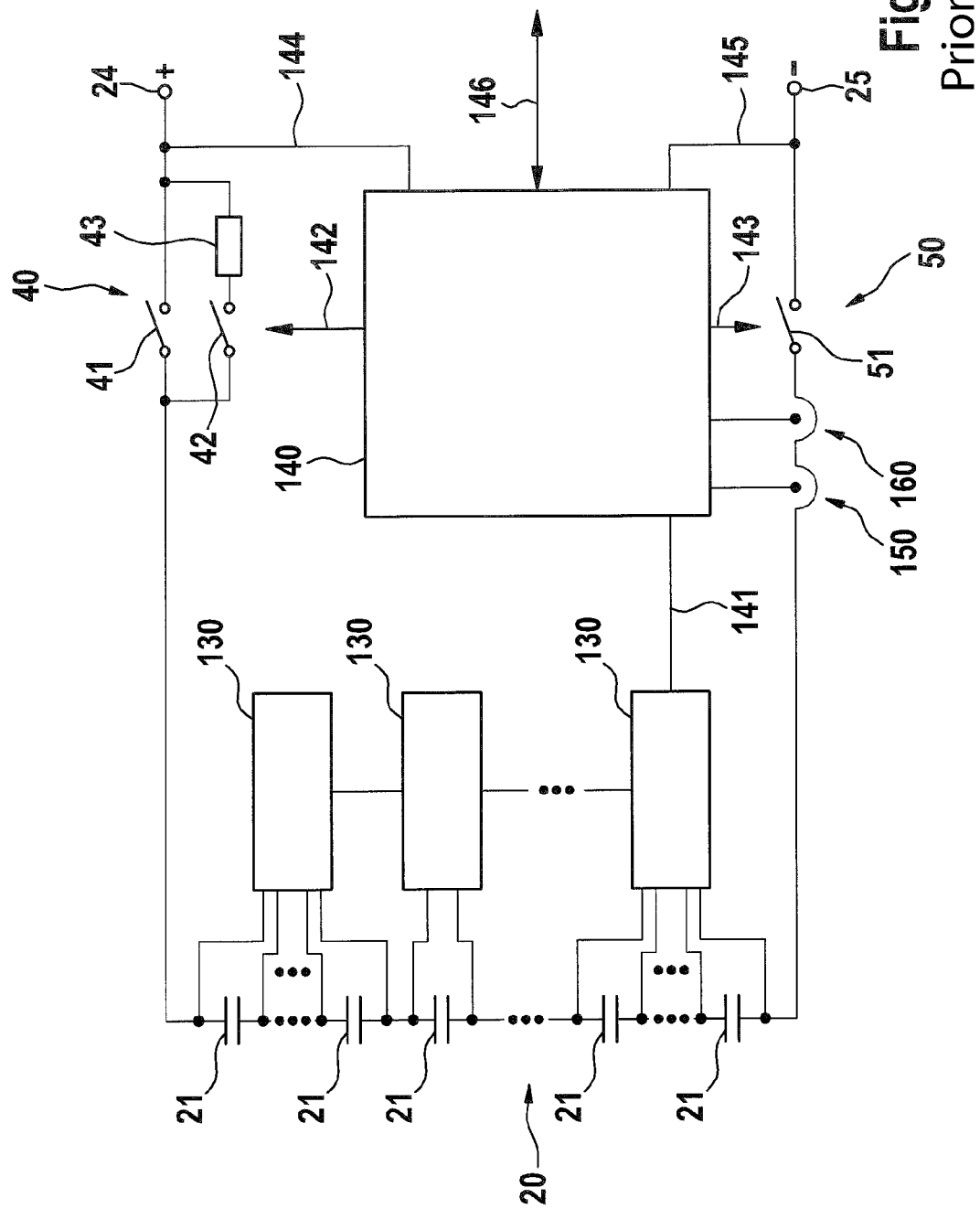
FIG. 3 shows the basic circuit diagram of a battery system known from the prior art with a traction battery formed from a plurality of battery cells and a battery management system.
Figure 4:
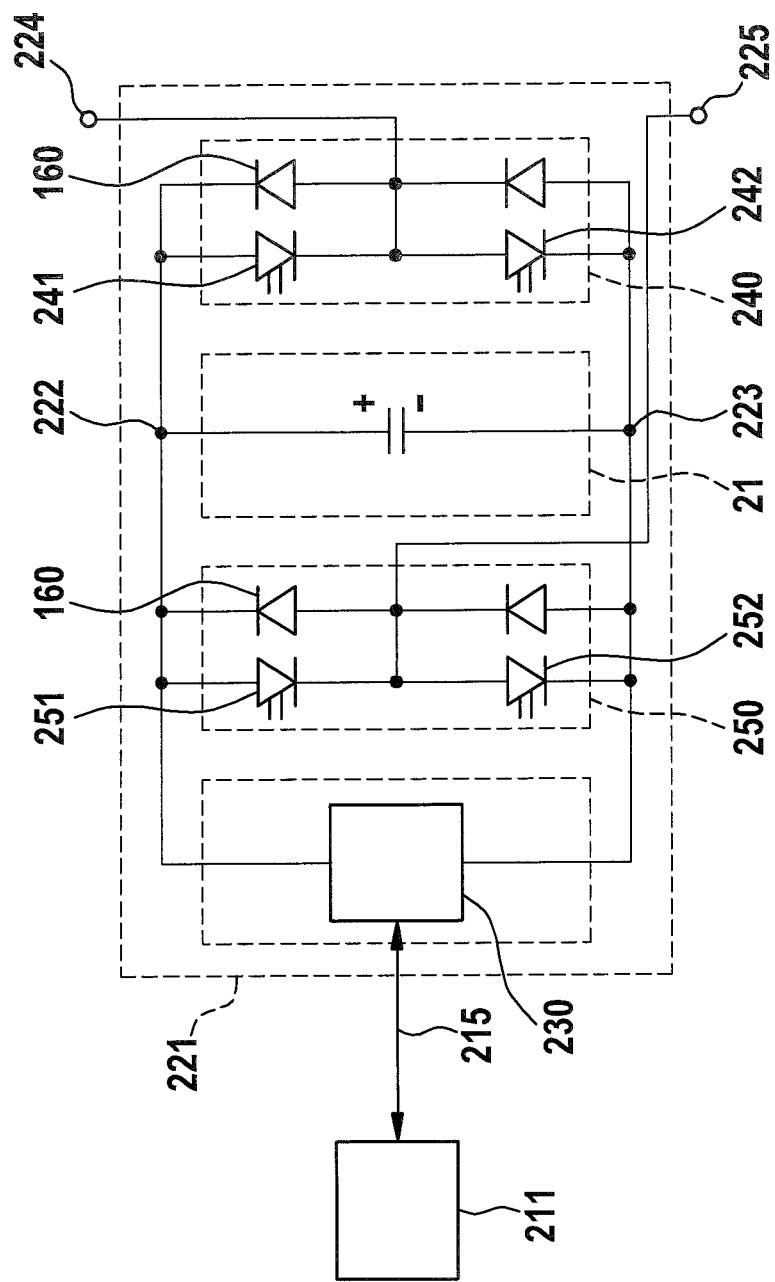
FIG. 4 shows the basic circuit diagram of a battery cell unit according to a first embodiment of the disclosure.

FIG. 4 illustrates the basic circuit diagram of a battery cell unit 221 according to a first embodiment of the disclosure. The battery cell unit 221 according to the first embodiment of the disclosure comprises a battery cell 21 and a coupling unit, which is formed from a first half-bridge (the right-hand half-bridge in FIG. 4) 240 comprising a first and a second power semiconductor 241, 242 and a second half-bridge (the left-hand half-bridge in FIG. 4) 250 comprising a first and a second power semiconductor 251, 252. The two half-bridges 240, 250 together form a full-bridge comprising four power semiconductors 241, 242, 251, 252. In each case one diode 260 is connected in parallel with the power semiconductors 241, 242, 251, 252, the forward direction of said diode being counter to the forward direction of the corresponding power semiconductor. In order to simplify the illustration, only one diode per half-bridge 240, 250 has been provided with the reference symbol 160.

The first half-bridge 240 is connected at a first connection associated with the first power semiconductor (the upper power semiconductor switch of the right-hand half-bridge in FIG. 4) 241 to the positive pole 222 of the battery cell 21 and at a second connection associated with the second power semiconductor 242 (the lower power semiconductor switch in the right-hand half-bridge in FIG. 4) to the negative pole 223 of the battery cell 21. The first half-bridge 240 is also connected at a central connection to a first output terminal 224 of the battery cell unit 221.

The second half-bridge 250 is connected at a first connection associated with the first power semiconductor (the upper power semiconductor switch in the left-hand half-bridge in FIG. 4) 251 to the positive pole 222 of the battery cell 21 and at a second connection associated with the second power semiconductor (the lower power semiconductor switch in the left-hand half-bridge in FIG. 4) 252 to the negative pole 223 of the battery cell 21. The second half-bridge 250 is also connected at a central connection to a second output terminal 225 of the battery cell unit 221.

The battery cell unit 221 according to the disclosure further comprises a monitoring and actuation unit 230 connected in parallel with the battery cell 21 for monitoring the function state of the battery cell 21. The monitoring and actuation unit 230 is designed in accordance with the disclosure with integrated actuation for the four power semiconductors 241, 242, 251, 252.

FIG. 4 also shows a battery management system 211 for a battery system comprising a plurality of battery cell units 221 according to the disclosure. The battery management system 211 is designed to communicate with the monitoring and actuation unit 230 or to exchange information items therewith. The information interchange between the battery management system 211 and the monitoring and actuation unit 20 is symbolized by means of the double arrow 215.

The battery cell unit 221 with intrinsic electric safety comprising a battery cell 21 with an output voltage with reversible polarity is realized, for example, with the arrangement illustrated in FIG. 4 as specified below.

The power semiconductors 241, 242, 251, 252 can be actuated by means of the monitoring and actuation unit 230 according to the disclosure in such a way that when, in the normal operating mode, the battery cell 21 is intended to output the battery cell voltage to the output terminals 224, 225 with a positive orientation (+$U_{battery\ cell}$), the first power semiconductor 241 in the first half-bridge 240 and the second power semiconductor 252 in the second half-bridge 250 are switched on and the other two power semiconductors 242, 251 are switched off.

The power semiconductors 241, 242, 251, 252 can be actuated further by means of the monitoring and actuation unit 230 according to the disclosure in such a way that when, in the normal operating mode, the battery cell 21 is intended to output the battery cell voltage to the output terminals 224, 225 with a negative orientation (-$U_{battery\ cell}$), the second power semiconductor 242 in the first half-bridge 240 and the first power semiconductor 251 in the second half-bridge 250 are switched on and the other two power semiconductors 241, 252 are switched off.

The power semiconductors 241, 242, 251, 252 can furthermore be actuated by means of the monitoring and actuation unit 230 according to the disclosure in such a way that, in the normal operating mode of the battery cell 21, optionally also a function state of the battery cell 21 can be set in which the battery cell 21 does not output an output voltage. In this state, either the first power semiconductors 241, 251 in the two half-bridges 240, 250 are switched on and the other two power semiconductors 242, 252 are switched off or the second power semiconductors 242, 252 in the two half-bridges 240, 250 are switched on and the other two power semiconductors 241, 252 are switched off.

If the monitoring and actuation unit 230, starting from the normal operating mode of the battery cell 21, identifies a threat of overcharging of the battery cell 21 on the basis of an upper limit value for the battery cell voltage being exceeded, either the first power semiconductors 241, 251 in the two half-bridges 240, 250 are switched on and the other two power semiconductors 242, 252 are switched off or alternatively the second power semiconductors 242, 252 in the two half-bridges 240, 250 are switched on and the other two power semiconductors 241, 242 are switched off by means of the monitoring and actuation unit 230. The battery cell 21 is then no longer charged any more and can thus be safely protected from overcharging, for example, in the event of the presence of a malfunction of a battery charger used.

If the monitoring and actuation unit 230, starting from the normal operating mode of the battery cell 21, identifies a threat of deep discharge of the battery cell 21 on the basis of a lower limit value of the battery cell voltage being undershot, either the first power semiconductors 241, 251 in the two half-bridges 240, 250 are switched on and the other two power semiconductors 242, 252 are switched off or alternatively the second power semiconductors 242, 252 in the two half-bridges 240, 250 are switched on and the other two power semiconductors 241, 242 are switched off by means of the monitoring and actuation unit 230. There is then no longer any current flowing through the actual battery cell 21. A current which is output to the outside possibly via an entire battery system in which the battery cell unit 221 according to the disclosure is arranged flows in the battery cell 21 of the battery cell unit 221 according to the disclosure under consideration here only via the power semiconductors (semiconductor switches) 241, 242, 251, 252 of the coupling unit of the battery cell unit 221.

If the monitoring and actuation unit 230, starting from the normal operating mode of the battery cell 21, identifies a threat of overload of the battery cell 21 by excessively high discharge currents which can occur, for example, as a consequence of an external short circuit of the battery as a result of a fault in the inverter, either the first power semiconductors 241, 251 in the two half-bridges 240, 250 are switched on and the other two power semiconductors 242, 252 are switched off or alternatively the second power semiconductors 242, 252 in the two half-bridges 240, 250 are switched on and the other two power semiconductors 241, 242 are switched off by means of the monitoring and actuation unit 230. There is then no longer any current flowing through the actual battery cell 21. The battery cell is thus protected from loading with impermissibly high discharge currents.

If the monitoring and actuation unit 230, starting from the normal operating mode of the battery cell 21, identifies a threat of overload of the battery cell 21 by excessively high charging currents for example at very low temperatures at which the battery cell 21 is particularly sensitive in respect of a lithium plating which can form in particular on the anode, either the first power semiconductors 241, 251 in the two half-bridges 240, 250 are switched on and the other two power semiconductors 242, 252 are switched off or alternatively the second power semiconductors 242, 252 in the two half-bridges 240, 250 are switched on and the other two power semiconductors 241, 242 are switched off by means of the monitoring and actuation unit 230. There is then no longer any current flowing through the actual battery cell 21. The battery cell is thus protected from loading with impermissibly high charging currents.

If a communication is made, for example in a vehicle by a battery management system 211, to the monitoring and actuation unit 230 of the battery cell unit 221 with intrinsic safety according to the disclosure in respect of the fact that the vehicle has had an accident, the battery cell 21 is discharged via one of the two half-bridges 240, 250 or else via both half-bridges 240, 250 in parallel. For example, for this purpose, the second power semiconductor 242, 252 in one of the two half-bridges 240, 250 or the second power semiconductors 242, 252 also in both of the half-bridges 240, 250 is/are switched on and the first power semiconductor 241, 251 in one of the two half-bridges 240, 250 or the first power semiconductors 241, 251 of the two half-bridges 240, 250 are operated in the so-called active operating mode as controllable resistance by means of the monitoring and actuation unit 230. Discharge of the battery cell 21 can also be performed with the rolls of the first power semiconductor switches 241, 251 and the second power semiconductor switches 241, 251 in the two half-bridges 240, 250 being swapped over in the same way. The battery cell unit 221 does not output a voltage at its terminals or output terminals 224, 225, and the battery cell 21 is nevertheless slowly discharged. The discharge currents that can be realized are limited by the thermal power loss which can be imposed on the power semiconductors 241, 251, 242, 252 operated as controllable resistance during the continuous operation mode. A power semiconductor 241, 251, 242, 252 operated, in particular, as controllable resistance including its thermal coupling and cooling is therefore designed corresponding to the requirements.

Figure 5:
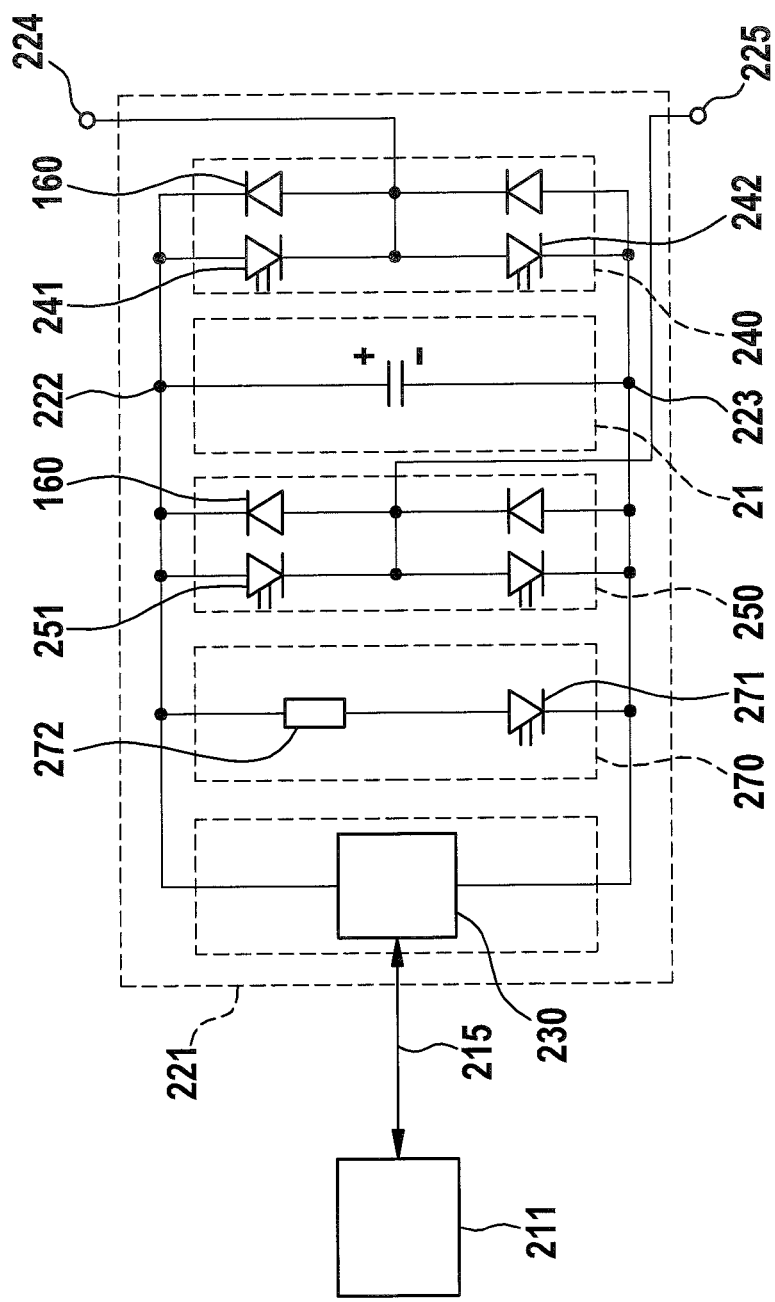
FIG. 5 shows the basic circuit diagram of a battery cell unit according to a second embodiment of the disclosure.

FIG. 5 illustrates the basic circuit diagram of a battery cell unit 221 according to a second embodiment of the disclosure. The battery cell unit 221 according to the second embodiment of the disclosure differs from the battery cell unit illustrated in FIG. 4 according to the first embodiment in that the battery cell unit 221 according to the second embodiment of the disclosure additionally comprises a discharge circuit 270 as an ultrafast discharge device (UFDD). For the designation of identical component parts of the battery cell units according to the first and second embodiment of the disclosure, the same reference symbols are also used. The discharge circuit 270 in this case comprises a series circuit comprising a power semiconductor 271 and a resistor 272, which series circuit is connected between the positive pole 222 and the negative pole 223, and is provided in the battery cell unit 221 for discharging the battery cell 21 by means of a discharge current flowing through the discharge circuit 270.

If a communication is made by a battery management system 211, which is arranged in a battery system comprising a plurality of such battery cell units 221, to the monitoring and actuation unit 230 of the battery cell unit 221 with intrinsic safety according to the disclosure in respect of the fact that the vehicle in which the battery system according to the disclosure is arranged has had an accident, the battery cell 21 is discharged quickly via the discharge circuit 270. In order to support the discharge circuit 270, the battery cell 21 can at the same time also be discharged via the two half-bridges 240, 250. In order to support the discharge circuit 270, in particular the two second power semiconductors 242, 252 in the two half-bridges 240, 250 are switched on by means of the monitoring and actuation unit 230. The battery cell unit 21 then does not output a voltage at its terminals or output terminals 224, 225 during the discharge. The discharge circuit 270 can be designed in such a way that the battery cell 21 can be discharged with very high discharge currents close to the short circuit. The battery cell 21 is thus brought very quickly into a safe state. Thus, situations in which the battery cell 21 is subject to severe mechanical deformation or is penetrated by pointed objects can be managed on the vehicle level.

In a similar way to as in the embodiment shown in FIG. 4, the first power semiconductors 241, 251 in the two half-bridges 240, 250 can also be operated in the active operating mode as a controllable resistance by means of the monitoring and actuation unit 230, as an auxiliary measure.

If the battery cell of the battery cell unit according to the disclosure is subjected to a nail penetration test or a crush test as part of UN transport tests, for example, or is in comparable situations, the monitoring and actuation unit 230 identifies via the evaluation of the battery cell voltage that the battery cell 21 is being discharged by currents without being operated. The identification of this operation can take place, for example, via a voltage dip in the battery cell 21. The monitoring and actuation unit 23 in the process immediately initiates the discharge of the battery cell 21 via the discharge circuit 270 according to the disclosure and the battery cell 21 is then discharged substantially via the discharge circuit 270.

If the battery cell 21 of the battery cell unit 221 according to the disclosure is subjected to severe heating, this can be identified by the monitoring and actuation unit 230. Since the time constants for the heating of the battery cell 21 are generally very high, discharge of the battery cell 21 can be brought about via the discharge circuit 270 according to the disclosure in good time before the temperature of the battery cell 24 exceeds critical values. Optionally, discharge of the battery cell 21 can also take place via the two half-bridges 240, 250. In order to assist the discharge circuit 270, in particular the two second power semiconductors 242, 252 in the two half-bridges 240, 250 are switched on by means of the monitoring and actuation unit 230. Thus, the battery cell 21 of the battery cell unit according to the disclosure is substantially safer than the battery cell known from the current prior art.

In the battery cell units 221 proposed here in accordance with the disclosure, the battery cell voltage present at the output terminals 224, 225 remains on activation of the safety measures which take place in the half-bridges 240, 250 via the change in the switching states or on activation of the ultrafast discharge device (UFDD) 270 the magnitude is still smaller than the maximum permissible battery cell voltage of, for example, 4.2 V. This likewise represents a considerable improvement in comparison with the current prior art since, otherwise, for example, on activation of a battery cell-internal fuse, very high negative voltages which may be up to −400 V in the case of electric vehicle batteries can occur, and these very high negative voltages present considerable problems to the electronics of a battery management system.

The battery cell units 221 according to the disclosure proposed here are not restricted to lithium-ion battery cells. They can also include other battery cell technologies, such as, for example, nickel-metal hybrid battery cells.

In the battery cell units 221 with intrinsic safety in accordance with the disclosure as set forth here comprising a battery cell 21 with an output voltage of reversible polarity, the overcharge safety devices (OSDs) used to date and the battery cell fuse can be dispensed with. The measures used for increasing safety on mechanical deformation or penetration, such as, for example, designing a battery cell with an integrated nail penetration safety device, can either likewise be dispensed with or can have at least a substantially simpler design. With the battery cell units 221 according to the disclosure proposed here, battery systems can be constructed whose battery management systems 211 are subject to much less stringent requirements than the battery systems known from the prior art. The electronics of the battery management systems 211 can therefore presumably be developed only with the conventional quality safety measures (ASIL classification QM) and does not need to adhere to ASIL C. The safety of the battery systems can be considerably improved in comparison with the current prior art. One example of the use of the battery cell units 221 with intrinsic electrical safety in accordance with the disclosure as proposed here is the battery direct inverter 210 illustrated in FIG. 6.

Owing to the functionality of the battery cell units 221 according to the disclosure proposed here, of reversing the polarity of the battery cell voltage at the terminals of the battery cell 21, the battery cell units 221 according to the disclosure are suitable in particular for use in such battery direct inverters 210 with output voltages which can be set in stages.

Figure 6:
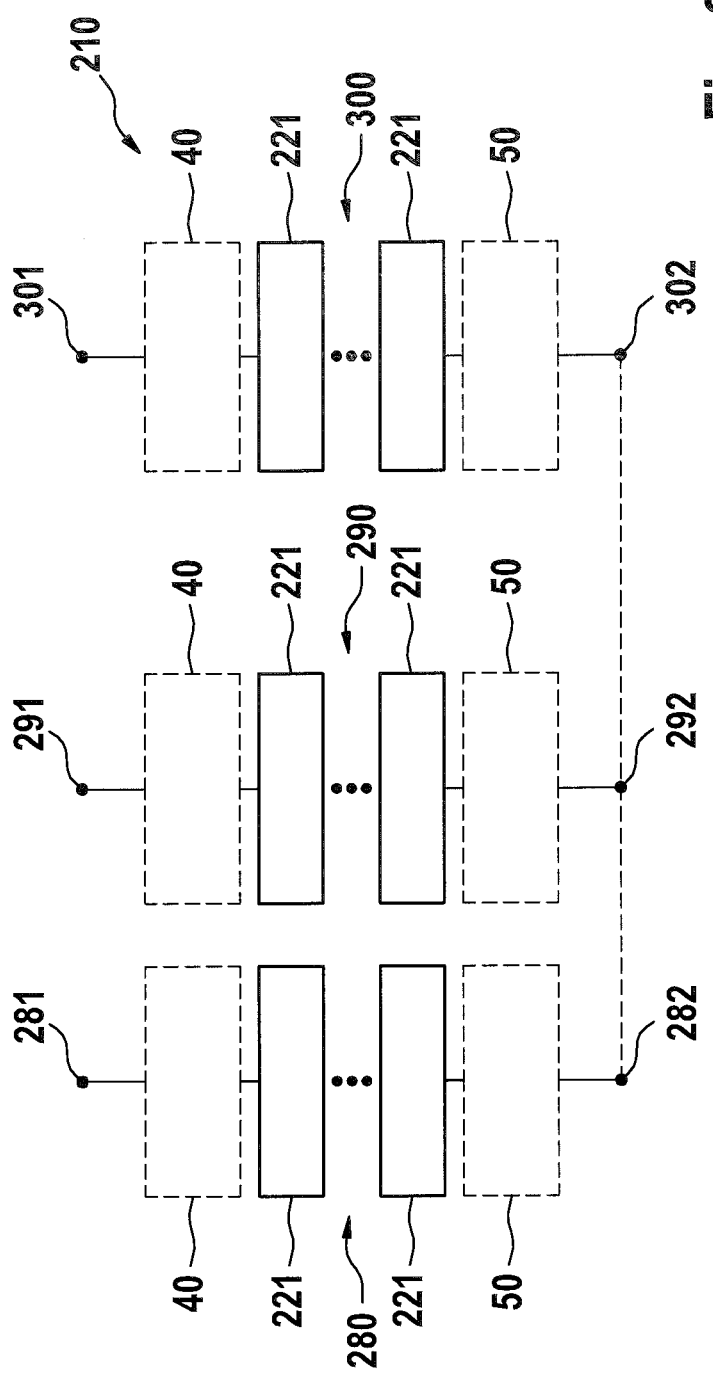
FIG. 6 shows the basic circuit diagram of a battery direct inverter with three battery strings in which in each case a plurality of the battery cell units according to the disclosure are connected in series.

The battery direct inverter 210 illustrated in FIG. 6 is a three-phase battery system with an output voltage which can be set in stages. The battery direct inverter 210 comprises three battery strings 280, 290, 300, which each have a series circuit comprising a plurality of battery cell units 221 according to the disclosure. These series circuits of battery strings 20, 290, 300 are connected to the positive battery string poles 281, 291, 301 in each case via a charging and disconnecting device 40 and to the negative battery string poles 282, 292, 302 in each case via a disconnecting device 50.

According to the disclosure, the battery cells or battery modules are actuated in this case in such a way that their operating parameters are within the respective limit values which are required for safe operation.

Thus, lithium-ion battery cells are typically operated within a voltage range Umin to Umax of 2.8 V to 4.2 V, or preferably 3.0 V to 4.2 V. This applies in particular to safety-relevant values Umin_safety or Umax_safety. However, these figures apply to the voltages U to be measured of the battery cell during no-load operation, i.e. when there is no current flowing through the battery cell. In this case, these limit values absolutely have to be taken into consideration since otherwise the electrodes could suffer damage.

The no-load voltage of the battery cells is dependent substantially on their state of charge. In this case, a state of charge SOC of 0% is typically assumed at a voltage Ubattery cell of 2.8 V, a state of charge of 20% at 3.5 V and a state of charge of 100% at 4.2 V, wherein these values are each dependent on the nature and material of the cathode, the anode and/or the electrolyte used.

If a current is flowing through a battery cell, the battery cell voltages Ubattery cell can deviate from the above figures. Assuming that the no-load voltage is 3.5 V and the internal resistance of the battery cell L at 25° C. is 10 mΩ, given a charging current of 100 A the voltage value Ubattery cell then to be measured would be 3.5 V+1.0 V=4.5 V. At a temperature of 0° C., the internal resistance of the battery cell is, for example, up to 50 mΩ, however, which would result in a voltage value Ubattery cell of 3.5 V−2.5 V=1.0 V at an exemplary discharge current of 50 A. Owing to the actuation applied and the sensors used, these voltage values are not achieved at room temperature or at 0° C., however. In general, during operation of the battery cells, the value for Umax can be between 4.2 V and 5.0 V and the value for Umin can be between 1.5 V and 4.2 V, preferably between 1.8 V and 4.15 V, but these values do not relate to the no-load voltage.

The above voltage values apply for a single battery cell. For a battery module, the number of cells connected in series or in parallel is a factor. Thus, the permissible module no-load voltage Ubattery module is between n×2.8 V to n×4.2 V, where n is the number of battery cells which are connected in series with one another.

Limit values for temperatures in the case of lithium-ion battery cells are approximately Tmin=−40° C. and Tmax=30° C. to 50° C., preferably 30° C. to 45° C., most preferably 35° C. to 40° C. For safety reasons, a maximum temperature Tmax_safety of 46° C. to 80° C., preferably 50° C. to 60° C. should not be exceeded. In addition, the maximum external temperature Texternal at which the battery cells are operated should not exceed 40° C.

The battery currents through the battery cells should not be outside a range of −1000 A to +1000 A, preferably −600 A to +600 A, further preferably −500 A to +500 A, further preferably −450 A to +450 A and further preferably −350 A to +350 A.

The internal pressure of a battery cell should not depart from the pressure range of 2 bar to 8 bar, preferably 3 bar to 7 bar.

The above discussion has been conducted by way of example for lithium-ion battery cells or lithium-ion battery modules, wherein the cited values apply in particular to lithium-ion battery cells with lithium-manganese-cobalt-oxide as active material for the cathode. However, the disclosure is not restricted to such battery cells, in particular not to lithium-ion battery cells. In practice, the numerical values for the operating parameters to be selected are therefore dependent on the respective battery cell type.

In addition to the above written disclosure, reference is hereby also made to the illustration in FIGS. 1 to 6 for further disclosure of the disclosure.

What is claimed is:

1. A method for monitoring a battery cell arranged in a battery cell device with a monitoring and actuation unit provided in the battery cell device comprising:
   operating a battery cell with a coupling unit which is arranged in a battery cell device and which comprises two half-bridges each including power semiconductors which form a full-bridge;
   establishing a fault situation or a hazard situation of the battery cell which deviates from a normal operating mode of the battery cell using the monitoring and actuation unit; and
   setting the battery cell to a safe state by actuating the coupling unit and/or a discharge circuit coupled to poles of the battery cell and configured to rapidly discharge the battery cell.

2. The method according to claim 1, further comprising:
   monitoring a battery cell voltage of the battery cell and/or a current flowing through the battery cell using the monitoring and actuation unit; and
   setting the power semiconductors of the two half-bridges to a switching state in which there is no current flowing through the battery cell in the event of the presence of a battery cell voltage with a magnitude which exceeds an upper voltage limit value and/or in the event of the presence of a battery cell voltage with a magnitude which falls below a lower voltage limit value and/or in the event of the presence of a charging current with a magnitude which exceeds a predetermined charging current limit value and/or in the event of the presence of a discharge current with a magnitude which exceeds a predetermined discharge current limit value.

3. The method according to claim 1, further comprising:
   determining a presence of the hazard situation using the monitoring and actuation unit on the basis of an information item communicated by the battery management system and/or an evaluation of a measured cell temperature of the battery cell and/or an evaluation of the battery cell voltage,
   wherein the hazard situation includes at least one of a cell temperature exceeding a predetermined temperature limit value, and a voltage dip in the battery cell voltage.

4. The method according to claim 3, further comprising:
   actuating the coupling unit in the event of the presence of the hazard situation to discharge the battery cell in such a way that, in at least one of the half-bridges, in each case one power semiconductor is switched on and the respective other power semiconductor is operated in an active operating mode as a controllable resistance.

5. The method according to claim 4, further comprising discharging the battery cell in the event of the presence of the hazard situation using the discharge circuit with a discharge current flowing through the discharge circuit which corresponds to a predetermined fraction of a short-circuit current of the battery cell.

* * * * *